(12) United States Patent
Sawamura et al.

(10) Patent No.: US 11,245,380 B2
(45) Date of Patent: Feb. 8, 2022

(54) ACOUSTIC WAVE DEVICE, HIGH-FREQUENCY FRONT-END CIRCUIT, AND COMMUNICATION DEVICE

(71) Applicant: Murata Manufacturing Co., Ltd., Nagaokakyo (JP)

(72) Inventors: Makoto Sawamura, Nagaokakyo (JP); Seiji Kai, Nagaokakyo (JP); Yutaka Kishimoto, Nagaokakyo (JP); Yuzo Kishi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/906,090

(22) Filed: Jun. 19, 2020

(65) Prior Publication Data

US 2020/0321938 A1    Oct. 8, 2020

Related U.S. Application Data

(63) Continuation of application No. PCT/JP2018/045214, filed on Dec. 10, 2018.

(30) Foreign Application Priority Data

Dec. 22, 2017  (JP) .............................. JP2017-245674

(51) Int. Cl.
*H03H 9/05*    (2006.01)
*H03H 9/54*    (2006.01)
(Continued)

(52) U.S. Cl.
CPC .............. *H03H 9/17* (2013.01); *H03F 3/245* (2013.01); *H03H 9/05* (2013.01); *H03H 9/13* (2013.01);
(Continued)

(58) Field of Classification Search
CPC .. H03H 9/17; H03H 9/13; H03H 9/54; H03H 9/05; H03F 3/245; H03F 2200/451; H04B 1/40
See application file for complete search history.

(56) References Cited

U.S. PATENT DOCUMENTS 8,569,936 B2 * 10/2013 Park ...................... H03H 9/131
310/364
2002/0121337 A1  9/2002 Whatmore et al.
(Continued)

FOREIGN PATENT DOCUMENTS

JP    10-19923 A    1/1998
JP    2004-503164 A    1/2004
(Continued)

OTHER PUBLICATIONS

Official Communication issued in International Patent Application No. PCT/JP2018/045214, dated Feb. 5, 2019.

*Primary Examiner* — Dinh T Le
(74) *Attorney, Agent, or Firm* — Keating & Bennett, LLP

(57) ABSTRACT

In an acoustic wave device, a piezoelectric body is directly or indirectly laminated on a silicon support substrate, and a functional electrode is provided on the piezoelectric body. A support layer is directly or indirectly laminated on the silicon support substrate, and the support layer is located outside the functional electrode when viewed in plan view. A silicon cover layer is provided on the support layer that includes an insulating material, and a space A is defined by the silicon support substrate, the support layer, and the silicon cover layer. The electric resistance of the silicon support substrate is higher than the electric resistance of the silicon cover layer.

20 Claims, 3 Drawing Sheets

(51) Int. Cl.
  *H03H 9/17*  (2006.01)
  *H03F 3/24*  (2006.01)
  *H03H 9/13*  (2006.01)
  *H04B 1/40*  (2015.01)

(52) U.S. Cl.
  CPC ............... *H03H 9/54* (2013.01); *H04B 1/40* (2013.01); *H03F 2200/451* (2013.01)

(56) References Cited

U.S. PATENT DOCUMENTS

| | | | | |
|---|---|---|---|---|
| 2013/0113576 | A1* | 5/2013 | Inoue | H03H 9/54 |
| | | | | 333/133 |
| 2015/0331066 | A1 | 11/2015 | Nakatani et al. | |
| 2016/0277003 | A1* | 9/2016 | Kikuchi | H03H 9/058 |
| 2019/0089321 | A1 | 3/2019 | Morinaga | |
| 2019/0165758 | A1* | 5/2019 | Sakai | H03H 9/6489 |
| 2019/0181828 | A1* | 6/2019 | Iwamoto | H03H 9/02897 |

FOREIGN PATENT DOCUMENTS

| | | | |
|---|---|---|---|
| JP | 2005-295363 | A | 10/2005 |
| JP | 2008-060382 | A | 3/2008 |
| JP | 2015-156626 | A | 8/2015 |
| JP | 2015-217473 | A | 12/2015 |
| WO | 2017/212677 | A1 | 12/2017 |

\* cited by examiner

ACOUSTIC WAVE DEVICE, HIGH-FREQUENCY FRONT-END CIRCUIT, AND COMMUNICATION DEVICE

CROSS REFERENCE TO RELATED APPLICATIONS

This application claims the benefit of priority to Japanese Patent Application No. 2017-245674 filed on Dec. 22, 2017 and is a Continuation Application of PCT Application No. PCT/JP2018/045214 filed on Dec. 10, 2018. The entire contents of each application are hereby incorporated herein by reference.

BACKGROUND OF THE INVENTION

1. Field of the Invention

The present invention relates to an acoustic wave device that includes a silicon support substrate and a silicon cover layer, a high-frequency front-end circuit, and a communication device.

2. Description of the Related Art

Japanese Unexamined Patent Application Publication (Translation of PCT Application) No. 2004-503164 discloses an acoustic wave device that has a package structure in which a hollow space is formed. A functional electrode is provided on a silicon substrate. An adhesive layer is provided on the silicon substrate so as to surround the functional electrode. A sealing member made of silicon is joined by this adhesive layer so as to face the silicon substrate. As a result, a hollow space is formed, and the functional electrode is located in the hollow space.

In the acoustic wave device that is described in Japanese Unexamined Patent Application Publication (Translation of PCT Application) No. 2004-503164 and that uses a support substrate made of silicon and a sealing member made of silicon, when the acoustic wave device is charged, an electric charge may sometimes flow into the support substrate, which is made of silicon. As a result, there is a possibility that an operation failure or breakage due to electrostatic discharge damage will occur in the functional electrode formed on the support substrate, which is made of silicon.

SUMMARY OF THE INVENTION

Preferred embodiments of the present invention provide acoustic wave devices in each of which electrostatic discharge damage due to charging is less likely to occur, high-frequency front-end circuits, and communication devices.

An acoustic wave device according to a preferred embodiment of the present invention includes a silicon support substrate, a piezoelectric body that is directly or indirectly laminated on the silicon support substrate, a functional electrode that is provided on the piezoelectric body, a support layer that is directly or indirectly laminated on the silicon support substrate and that is located outside the functional electrode when viewed in plan view, the support layer including an insulating material, and a silicon cover layer that is laminated on the support layer. A space is defined by the silicon support substrate, the support layer, and the silicon cover layer, and an electric resistance of the silicon support substrate is higher than an electric resistance of the silicon cover layer.

A high-frequency front-end circuit according to preferred embodiment of the present invention includes an acoustic wave device according to a preferred embodiment of the present invention and a power amplifier.

A communication device according to a preferred embodiment of the present invention includes a high-frequency front-end circuit according to a preferred embodiment of the present invention and an RF signal processing circuit.

According to preferred embodiments the present invention, acoustic wave devices in which electrostatic discharge damage of a functional electrode is less likely to occur, high-frequency front-end circuits, and communication devices are able to be provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Specific preferred embodiments of the present invention will be described below with reference to the drawings to clarify the present invention.

The preferred embodiments described in the present specification are examples, and the features, components, and elements according to the different preferred embodiments may be partially replaced or combined with one another.

Figure 1:
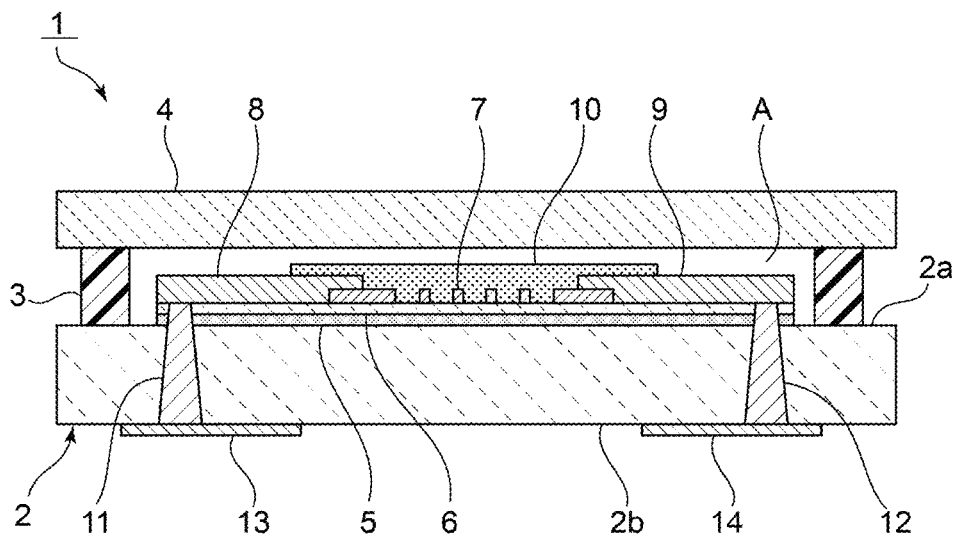
FIG. 1 is a sectional front view of an acoustic wave device according to a first preferred embodiment of the present invention.

FIG. 1 is a sectional front view of an acoustic wave device according to a first preferred embodiment of the present invention. An acoustic wave device 1 includes a silicon support substrate 2. A support layer 3 that is made of a resin is provided on the silicon support substrate 2. When viewed in plan view, the support layer 3 has a frame shape. A silicon cover layer 4 is provided on the support layer 3 to seal an upper opening of the support layer 3.

As a result, a space A is defined by the silicon support substrate 2, the support layer 3, and the silicon cover layer 4.

In the space A, a low-acoustic-velocity film 5 is laminated on the silicon support substrate 2. A piezoelectric body 6 is laminated on the low-acoustic-velocity film 5. An interdigital transducer (IDT) electrode 7 that defines and functions as a functional electrode is provided on the piezoelectric body

6. Thus, the piezoelectric body 6 is positioned at a portion surrounded by the support layer 3.

When the wavelength that is defined by the pitch of electrode fingers of the IDT electrode 7 is $\lambda$, the thickness of the piezoelectric body 6 is preferably about $3.5\lambda$ or less, for example.

The support layer 3 is directly provided on the silicon support substrate 2, and the support layer 3 is not located on the piezoelectric body 6. Thus, the piezoelectric body 6 is less likely to break by the stress generated in the support layer 3 during the manufacturing process and during operation.

Connecting electrodes 8 and 9 are electrically connected to the IDT electrode 7.

A dielectric film 10 covers the IDT electrode 7.

Upper end portions of through-via electrodes 11 and 12 are connected to the connecting electrodes 8 and 9, respectively. The through-via electrodes 11 and 12 extend through the silicon support substrate 2, the low-acoustic-velocity film 5, and the piezoelectric body 6. Consequently, the connecting electrodes 8 and 9 are not directly in contact with the silicon support substrate 2. Thus, the current that flows through the connecting electrodes 8 and 9 is less likely to leak to the side on which the silicon support substrate 2, which is a semiconductor, is provided. Therefore, deterioration in the characteristics is less likely to occur. Lower end portions of the through-via electrodes 11 and 12 extend to a second main surface 2b of the silicon support substrate 2. The second main surface 2b is a main surface of the silicon support substrate 2 that is located on the side opposite to the side on which the piezoelectric body 6 is provided on the silicon support substrate 2. Terminal electrodes 13 and 14 are provided on the second main surface 2b. The terminal electrodes 13 and 14 are connected to the lower end portions of the through-via electrodes 11 and 12, respectively.

A feature of the acoustic wave device 1 is that the electric resistance of the silicon support substrate 2 is higher than the electric resistance of the silicon cover layer 4. Thus, when the acoustic wave device 1 is charged, an electric charge flows from the side on which the silicon support substrate 2 is provided to the side on which the silicon cover layer 4 having a low electric resistance is provided. Therefore, electrostatic discharge damage of the IDT electrode 7 defining and functioning as a functional electrode is less likely to occur.

In the acoustic wave device 1, since the IDT electrode 7 is provided on the piezoelectric body 6, an acoustic wave is able to be excited in the piezoelectric body 6 by applying an alternating-current electric field to the IDT electrode 7.

The low-acoustic-velocity film 5 is made of a low acoustic velocity material, and the acoustic velocity of a bulk wave that propagates across the low-acoustic-velocity film 5 is lower than the acoustic velocity of a bulk wave that propagates across the piezoelectric body 6. As the low acoustic velocity material, a suitable material that satisfies the above acoustic velocity relationship between the silicon support substrate 2 and the piezoelectric body 6 may be used. As the low acoustic velocity material, for example, a silicon oxide, glass, silicon oxynitride, tantalum oxide, a compound provided by adding fluorine, carbon, or boron to a silicon oxide, or a medium that includes at least one of the above-described materials as a main component may preferably be used.

The acoustic velocity of a bulk wave that propagates across the silicon support substrate 2 is higher than the acoustic velocity of an acoustic wave that propagates across the piezoelectric body 6. Thus, the acoustic wave device 1 has a structure in which the silicon support substrate 2, which defines and functions as a high-acoustic-velocity support substrate, the low-acoustic-velocity film 5, and the piezoelectric body 6 are laminated together, and thus, energy of an excited acoustic wave is able to be effectively confined to the piezoelectric body 6. In the case where the acoustic wave device 1 has such a multilayer structure, the thickness of the piezoelectric body 6 is normally considerably smaller than the thickness of a piezoelectric single-crystal substrate included in an acoustic wave device that includes a piezoelectric single crystal substrate. When the wavelength that is defined by the pitch of the electrode fingers of the IDT electrode 7 is $\lambda$, the thickness of the piezoelectric body 6 is preferably about $3.5\lambda$ or less, for example. As a result, the Q value is able to be increased.

In the case where the piezoelectric body 6 has a small thickness as described above, as a result of the above-described charging, electrostatic discharge damage is less likely to occur not only in the IDT electrode 7 but also in a functional component or element in which the IDT electrode 7 and the piezoelectric body 6 are laminated together. However, in the acoustic wave device 1 of the first preferred embodiment, as described above, the electric resistance of the silicon cover layer 4 is lower than the electric resistance of the silicon support substrate 2, and thus, a generated electric charge flows promptly to the silicon cover layer 4, so that the occurrence of electrostatic discharge damage of the functional component or element is able to be significantly reduced or prevented. In the first preferred embodiment, although the piezoelectric body 6 is indirectly laminated on the silicon support substrate 2 with the low-acoustic-velocity film 5 interposed between the piezoelectric body 6 and the silicon support substrate 2, the piezoelectric body 6 may be directly laminated on the silicon support substrate 2. In addition, the energy of the acoustic wave is able to be effectively confined to the piezoelectric body 6, and electrostatic discharge damage is less likely to occur in the IDT electrode 7.

Although the support layer 3 is preferably made of a synthetic resin, for example, a polyimide, the support layer 3 may be made of an insulating material other than a synthetic resin, an example of the insulating material being an inorganic insulating material. The support layer 3 preferably includes, for example, a photosensitive polyimide-based resin such as a photosensitive thermosetting polyimide. Accordingly, a reduction in the manufacturing costs of the support layer 3 may be provided, and simplification of the manufacturing process may be provided.

In the case where the support layer 3 is made of a resin, the silicon cover layer and the silicon support substrate 2 preferably include, respectively, a p-type semiconductor and an n-type semiconductor, for example. A resin has a negative polarity as a result of being charged. Thus, in the case where the silicon support substrate 2 and the silicon cover layer 4 respectively include an n-type semiconductor and a p-type semiconductor, an electric charge generated in the silicon support substrate 2 flows more promptly to the silicon cover layer 4. Therefore, an operation failure or breakage due to electrostatic discharge is further less likely to occur.

The conducting types of the semiconductors of the silicon support substrate 2 and the silicon cover layer 4 are not limited to the above combination. Both the silicon support substrate 2 and the silicon cover layer 4 may be made of an n-type semiconductor or may be made of a p-type semiconductor, for example.

The dielectric film 10 covers the IDT electrode 7. Thus, frequency adjustment is able to be performed by adjusting the thickness or the material of the dielectric film 10. In addition, as a result of providing the dielectric film 10, the IDT electrode 7 is able to be protected from the surroundings.

Although the material of the dielectric film 10 is not particularly limited, an inorganic dielectric material, for example, a silicon oxide or silicon oxynitride, may preferably be used.

The space A is preferably sealed, for example. As a result, the space A is not easily influenced by moisture in air, and thus, it is unlikely that variations in the characteristics of the acoustic wave device 1 will occur.

As shown in FIG. 1, the through-via electrodes 11 and 12 are preferably located in the region surrounded by the support layer 3 when viewed in plan view, for example. As a result, the connecting electrodes 8 and 9 are able to be respectively connected to the through-via electrodes 11 and 12 in the region (space A) surrounded by the support layer 3, and thus, the connecting electrodes 8 and 9 are able to be sealed in the region surrounded by the support layer 3. Therefore, the connecting electrodes 8 and 9 are not easily influenced by the moisture in the air. By providing the through-via electrodes 11 and 12, even if charging occurs in the functional component or element of the silicon support substrate 2, electric charges flow promptly to the side on which the silicon cover layer 4 is provided, and in addition, the electric charges are able to escape to the side on which the second main surface 2b of the silicon support substrate 2 is located, that is, the side on which the terminal electrodes 13 and 14 are provided, via the through-via electrodes 11 and 12. Thus, the electric charges are able to promptly escape to an electrode land or the like on a mounting substrate to which the terminal electrodes 13 and 14 are joined. This also reduces the probability of the occurrence of electrostatic discharge damage of the IDT electrode 7 and the piezoelectric body 6 in the functional component or element.

In the acoustic wave device 1, the low-acoustic-velocity film 5 is located in the region surrounded by the support layer 3. However, the low-acoustic-velocity film 5 may extend to the lower surface of the support layer 3 and to the outside of the support layer 3. Accordingly, the support layer 3 is indirectly laminated on a first main surface 2a of the silicon support substrate 2. The support layer 3 is preferably directly laminated on the first main surface 2a as shown in FIG. 1, for example. Accordingly, the manufacturing process is able to be simplified.

In addition, although the support layer 3 has a frame shape, the shape of the support layer 3 is not limited to a frame shape as long as the support layer 3 surrounds the above-described functional component or element, which includes the piezoelectric body 6 and the IDT electrode 7. Thus, the space A is not limited to being a sealed space.

The IDT electrode 7, the connecting electrodes 8 and 9, the through-via electrodes 11 and 12, and the terminal electrodes 13 and 14 are each made of a suitable metal or a suitable alloy, and their materials are not particularly limited.

The electrode structure of the functional electrode, which includes the IDT electrode 7, is also not particularly limited, and the electrode structure including the IDT electrode 7 may be modified to provide various functional components or elements, for example, an acoustic wave resonator and an acoustic wave filter.

Figure 2:
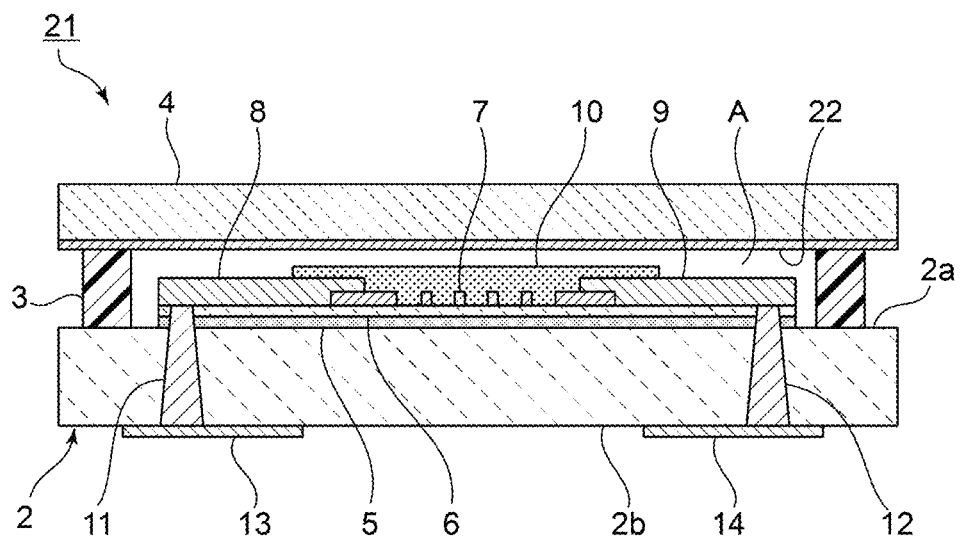
FIG. 2 is a sectional front view of an acoustic wave device according to a second preferred embodiment of the present invention.

FIG. 2 is a sectional front view of an acoustic wave device according to a second preferred embodiment of the present invention.

In an acoustic wave device 21 of the second preferred embodiment, a metallic film 22 is provided on the lower surface of the silicon cover layer 4, that is, on the entire or substantially the entire main surface of the silicon cover layer 4 that faces the silicon support substrate 2. The acoustic wave device 21 is similar to the acoustic wave device 1, except with regard to the features described above. Thus, components of the acoustic wave device 21 that are the same as or similar to the components of the acoustic wave device 1 are denoted by the same reference signs, and the acoustic wave device 21 relies on the description of the acoustic wave device 1.

The metallic film 22 is made of a suitable metal, for example, Cu or Al or a suitable alloy. The electric resistance of the metallic film 22 is lower than the electric resistance of the silicon cover layer 4. Accordingly, even if the functional component or element of the silicon support substrate 2 is charged, an electric charge flows more promptly from the silicon support substrate 2 to the side on which the silicon cover layer 4 is provided. Therefore, the probability the occurrence of electrostatic discharge damage of the IDT electrode 7 and the piezoelectric body 6 in the functional component or element is able to be more effectively reduced.

The metallic film 22 does not need to be provided over the entire or substantially the entire main surface of the silicon cover layer 4. It is only necessary for the metallic film 22 to be provided at an interface between the support layer 3 and the silicon cover layer 4. The metallic film 22 is preferably provided over the entire or substantially the entire surface as shown in FIG. 2, for example. As a result, an electric charge is able to move more promptly. Therefore, an operation failure or breakage due to electrostatic discharge is further less likely to occur.

In addition, the metallic film 22 may extend to the side surface or the upper surface of the silicon cover layer 4.

Figure 3:
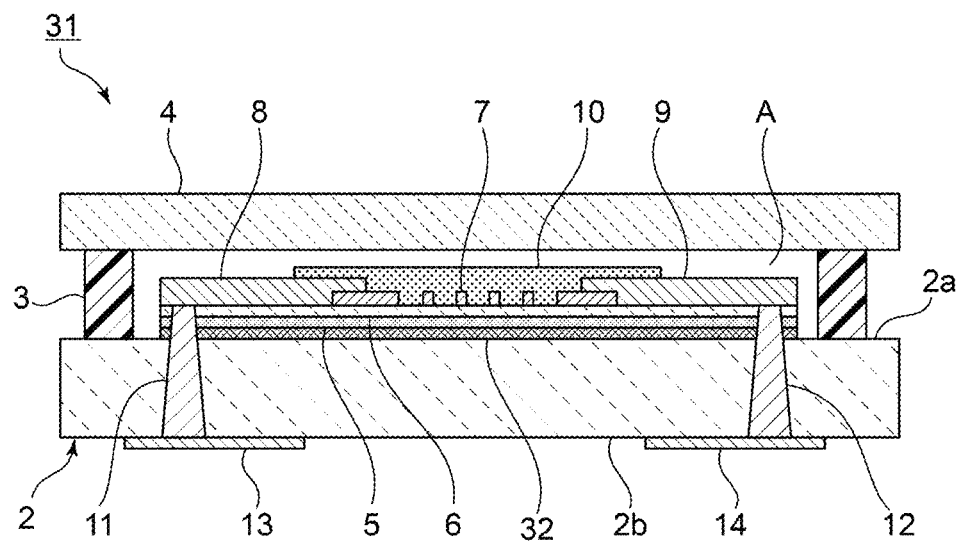
FIG. 3 is a sectional front view of an acoustic wave device according to a third preferred embodiment of the present invention.

FIG. 3 is a sectional front view of an acoustic wave device according to a third preferred embodiment of the present invention. In an acoustic wave device 31, a high-acoustic-velocity film 32 is provided on the silicon support substrate 2. The low-acoustic-velocity film 5 and the piezoelectric body 6 are laminated on the high-acoustic-velocity film 32. In other words, the acoustic wave device 31 is similar to the acoustic wave device 1, except with regard to the high-acoustic-velocity film 32. Here, the high-acoustic-velocity film 32 is made of a high acoustic velocity material, and the acoustic velocity of a bulk wave that propagates across the high-acoustic-velocity film 32 is higher than the acoustic velocity of an acoustic wave that propagates across the piezoelectric body 6. Various materials may be used as the high acoustic velocity material, and examples of such various materials include aluminum oxide, silicon carbide, silicon nitride, silicon oxynitride, silicon, sapphire, lithium tantalate, lithium niobate, quartz crystal, alumina, zirconia, cordierite, mullite, steatite, forsterite, magnesia, diamond-like carbon (DLC), diamond, a medium that includes at least one of the above-described materials as a main component, and a medium that includes a mixture of the above-described materials as a main component. In order to confine an acoustic wave to a portion in which the piezoelectric body 6 and the low-acoustic-velocity film 5 are laminated together, the film thickness of the high-acoustic-velocity film 32 is preferably thick, and the film thickness of the high-acoustic-velocity film 32 is preferably about 0.5 times or more of the wavelength $\lambda$ of the acoustic wave and is more preferably about 1.5 times or more of the wavelength $\lambda$ of the acoustic wave, for example.

As described above, also in the case where the high-acoustic-velocity film 32 is provided, the energy of an acoustic wave is able to be effectively confined to the piezoelectric body 6. Also in the acoustic wave device 31, the electric resistance of the silicon cover layer 4 is relatively low, and thus, an electric charge flows promptly to the silicon cover layer 4 from the side on which the silicon support substrate 2 is provided. Thus, as in the first preferred embodiment, the occurrence of electrostatic discharge damage of the IDT electrode 7 and the piezoelectric body 6 in the functional component or element is able to be significantly reduced or prevented.

Figure 4:
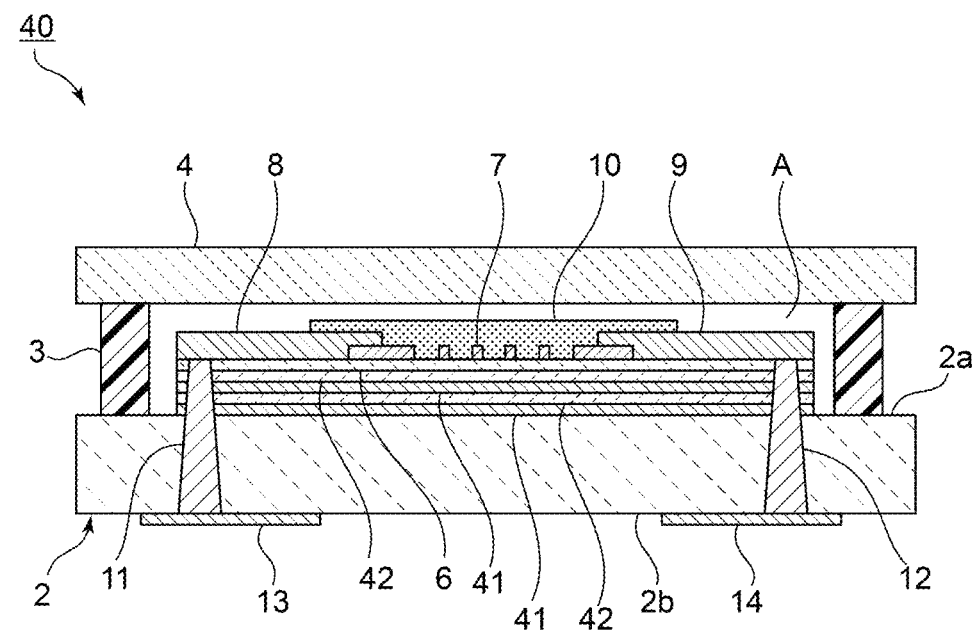
FIG. 4 is a sectional front view of an acoustic wave device according to a fourth preferred embodiment of the present invention.

FIG. 4 is a sectional front view of an acoustic wave device according to a fourth preferred embodiment of the present invention. In an acoustic wave device 40 of the fourth preferred embodiment, an acoustic reflection film is laminated between the silicon support substrate 2 and the piezoelectric body 6. The acoustic wave device 40 does not include either a low-acoustic-velocity film or a high-acoustic-velocity film. The rest of the features, components, and elements of the acoustic wave device 40 are similar to the acoustic wave device 31. The acoustic reflection film includes high-acoustic-impedance layers 41 each having a relatively high acoustic impedance and low-acoustic-impedance layers 42 each having a relatively low acoustic impedance. In FIG. 4, the two high-acoustic-impedance layers 41 and the two low-acoustic-impedance layers 42 are alternately laminated together starting from the side on which the first main surface 2a of the silicon support substrate 2 is located. However, the number of the high-acoustic-impedance layers 41 and the number of the low-acoustic-impedance layers 42 laminated together in the acoustic reflection film are not limited to the above.

The material of the high-acoustic-impedance layers 41 and the material of the low-acoustic-impedance layers 42 are not particularly limited as long as the above-described relative relationship between the acoustic impedances is satisfied. For example, an inorganic material such as a metal, a semiconductor, or a ceramic may be used, or an organic material such as a synthetic resin may be used. A metal having a relatively high acoustic impedance or a ceramic having a high acoustic impedance may preferably be used for the high-acoustic-impedance layers 41. A ceramic, a resin material, or the like that has a relatively low acoustic impedance may preferably be used for the low-acoustic-impedance layers 42. A metal, for example, Ag, that has a high acoustic impedance may be used for the high-acoustic-impedance layers 41, and a metal, for example, Pb, that has a low acoustic impedance may be used for the low-acoustic-impedance layers 42. In other words, a combination of metal materials or a combination of ceramic materials may be employed as long as the above-described relative relationship between the acoustic impedances is satisfied.

The low-acoustic-impedance layer 42 and the high-acoustic-impedance layer 41 are laminated together, and each of the high-acoustic-impedance layer 41 is positioned farther from the piezoelectric body 6 than a corresponding one of the low-acoustic-impedance layers 42 is. Also in the acoustic wave device 40 including such an acoustic reflection film, the energy of an acoustic wave is able to be effectively confined to the piezoelectric body 6. In addition, also in the acoustic wave device 40, the electric resistance of the silicon cover layer 4 is relatively low, and thus, an electric charge flows promptly to the silicon cover layer 4 from the side on which the silicon support substrate 2 is provided. Thus, also in the fourth preferred embodiment, the occurrence of electrostatic discharge damage of the IDT electrode 7 and the piezoelectric body 6 in the functional component or element is able to be significantly reduced or prevented.

Each of the acoustic wave devices of the above-described preferred embodiments is able to be used as a duplexer or the like of a high-frequency front-end circuit. An example of this case will be described below.

Figure 5:
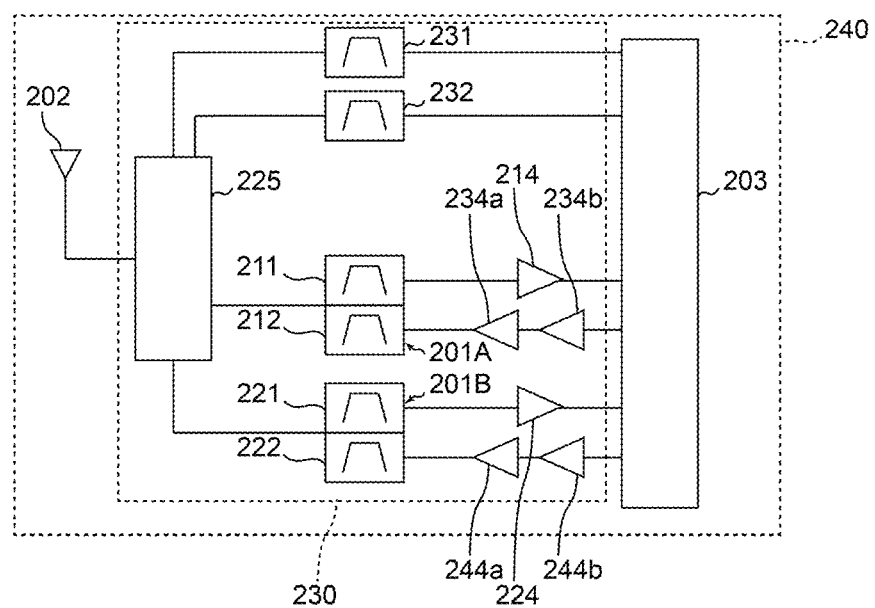
FIG. 5 is a diagram showing a communication device that includes a high-frequency front-end circuit.

FIG. 5 is a diagram showing a communication device and a high-frequency front-end circuit according to a preferred embodiment of the present invention. FIG. 5 also shows components each of which is connected to a high-frequency front-end circuit 230, the components including, for example, an antenna element 202 and an RF signal processing circuit (RFIC) 203. The high-frequency front-end circuit 230 and the RF signal processing circuit 203 are included in a communication device 240. The communication device 240 may include a power supply, a CPU, or a display, for example.

The high-frequency front-end circuit 230 includes a switch 225, duplexers 201A and 201B, low-noise amplifier circuits 214 and 224, and power amplifier circuits 234a, 234b, 244a, and 244b. The high-frequency front-end circuit 230 and the communication device 240, which are shown in FIG. 5, are respectively an example of a high-frequency front-end circuit and an example of a communication device and are not limited to having the above features, components, and elements.

The duplexer 201A includes filters 211 and 212. The duplexer 201B includes filters 221 and 222. The duplexers 201A and 201B are connected to the antenna element 202 via the switch 225. Each of the above-described acoustic wave devices may be one of the duplexers 201A and 201B or may be one of the filters 211, 212, 221, and 222.

In addition, each of the above-described acoustic wave devices is able to also be applied to a multiplexer including three or more filters, for example, a triplexer in which an antenna terminal is shared by three filters or a hexaplexer in which an antenna terminal is shared by six filters.

In other words, the above-described acoustic wave devices include an acoustic wave resonator, a filter, a duplexer, and a multiplexer including three or more filters. The multiplexer is not limited to including both a transmission filter and a reception filter and may include only a transmission filter or only a reception filter.

The switch 225 connects, in accordance with a control signal from a controller (not shown), the antenna element 202 and a signal path that carries a predetermined band to each other and is preferably, for example, a single-pole, double-throw (SPDT) switch. The number of signal paths to be connected to the antenna element 202 is not limited to one and may be more than one. In other words, the high-frequency front-end circuit 230 may provide carrier aggregation.

The low-noise amplifier circuit 214 is a reception amplifier circuit that amplifies a high-frequency signal (here, a high-frequency reception signal) that has passed through the antenna element 202, the switch 225, and the duplexer 201A and outputs the amplified signal to the RF signal processing circuit 203. The low-noise amplifier circuit 224 is a reception amplifier circuit that amplifies a high-frequency signal (here, a high-frequency reception signal) that has passed through the antenna element 202, the switch 225, and the duplexer 201B and outputs the amplified signal to the RF signal processing circuit 203.

The power amplifier circuits 234a and 234b are each a transmission amplifier circuit that amplifies a high-frequency signal (here, a high-frequency transmission signal) that has been output by the RF signal processing circuit 203 and outputs the amplified signal to the antenna element 202 via the duplexer 201A and the switch 225. The power amplifier circuits 244a, and 244b are each a transmission amplifier circuit that amplifies a high-frequency signal (here, a high-frequency transmission signal) that has been output by the RF signal processing circuit 203 and outputs the amplified signal to the antenna element 202 via the duplexer 201B and the switch 225.

The RF signal processing circuit 203 performs signal processing, for example, down conversion on a high-frequency reception signal that has been input from the antenna element 202 via a reception signal path and outputs a reception signal that is generated as a result of the signal processing. In addition, the RF signal processing circuit 203 performs signal processing, for example, up conversion on a transmission signal that has been input thereto and outputs a high-frequency transmission signal that is generated as a result of the signal processing to the power amplifier circuits 234b and 244b. The RF signal processing circuit 203 is, for example, an RFIC. The communication device may include a baseband (BB) IC. The BBIC performs signal processing on a received signal processed by the RFIC. In addition, the BBIC performs signal processing on a transmission signal and outputs the processed transmission signal to the RFIC. A reception signal that has been processed by the BBIC and a transmission signal that has not yet been processed by the BBIC are, for example, an image signal and an audio signal.

The high-frequency front-end circuit 230 may include duplexers according to modifications of the duplexers 201A and 201B, instead of the duplexers 201A and 201B.

In contrast, filters 231 and 232 in the communication device 240 are connected between the RF signal processing circuit 203 and the switch 225, and the low-noise amplifier circuits 214 and 224 and the power amplifier circuits 234a, 234b, 244a, and 244b are not provided between the filters 231 and 232 and the RF signal processing circuit 203 and are also not provided between the filters 231 and 232 and the switch 225. Similar to the duplexers 201A and 201B, the filters 231 and 232 are connected to the antenna element 202 via the switch 225.

Although the acoustic wave devices, the high-frequency front-end circuits, and the communication devices according to preferred embodiments of the present invention have been described above with respect to the preferred embodiments, other preferred embodiments that are obtained by combining arbitrary components of the above-described preferred embodiments, modifications that are obtained by making various modifications devised by those skilled in the art within the gist of the present invention to the above-described preferred embodiments, and various devices that include the high-frequency front-end circuit and the communication device according to the present invention built therein are also included in the scope of the present invention.

The preferred embodiments of the present invention are able to be widely used as a filter, a multiplexer that is applicable to a multi-band system, a front-end circuit, and a communication device in communication apparatuses, for example, cellular phones.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
   a silicon support substrate;
   a piezoelectric body directly or indirectly laminated on the silicon support substrate;
   a functional electrode provided on the piezoelectric body;
   a support layer directly or indirectly laminated on the silicon support substrate and located outside the functional electrode when viewed in plan view, the support layer being made of an insulating material;
   a silicon cover layer laminated on the support layer; and
   a plurality of through-via electrodes extending through the silicon support substrate; wherein
   a space is defined by the silicon support substrate, the support layer, and the silicon cover layer;
   an electric resistance of the silicon support substrate is higher than an electric resistance of the silicon cover layer; and
   a first end portion of each of the through-via electrodes is electrically connected to the functional electrode, and a second end portion of each of the through-via electrodes extends to a surface of the silicon support substrate, the surface being located on a side opposite to a side on which the piezoelectric body is laminated on the silicon support substrate.

2. The acoustic wave device according to claim 1, wherein the support layer includes a photosensitive polyimide-based resin.

3. The acoustic wave device according to claim 2, wherein the silicon cover layer is made of a p-type semiconductor; and
   the silicon support substrate is made of an n-type semiconductor.

4. The acoustic wave device according to claim 1, wherein a metallic film is provided on a joint surface of the silicon cover layer to which the support layer is joined.

5. The acoustic wave device according to claim 4, wherein the metallic film is provided over an entirety or substantially and entirety of the joint surface of the silicon cover layer to which the support layer is joined.

6. The acoustic wave device according to claim 1, wherein the support layer has a frame shape surrounding the functional electrode; and
   the piezoelectric body is positioned at a portion surrounded by the support layer.

7. The acoustic wave device according to claim 1, wherein the functional electrode is an interdigital transducer (IDT) electrode.

8. The acoustic wave device according to claim 7, wherein, when a wavelength that is defined by a pitch of electrode fingers of the IDT electrode is λ, a thickness of the piezoelectric body is about 3.5λ or less.

9. The acoustic wave device according to claim 1, wherein the piezoelectric body is directly laminated on the silicon support substrate.

10. The acoustic wave device according to claim 1, further comprising:
    a low-acoustic-velocity film laminated between the silicon support substrate and the piezoelectric body and made of a low acoustic velocity material; wherein
    an acoustic velocity of a bulk wave that propagates across the low-acoustic-velocity film is lower than an acoustic velocity of a bulk wave that propagates across the piezoelectric body.

11. The acoustic wave device according to claim 10, further comprising:
a high-acoustic-velocity film laminated between the silicon support substrate and the low-acoustic-velocity film and made of a high acoustic velocity material; wherein
an acoustic velocity of a bulk wave that propagates across the high-acoustic-velocity film is higher than an acoustic velocity of an acoustic wave that propagates across the piezoelectric body.

12. The acoustic wave device according to claim 1, further comprising an acoustic reflection film laminated between the silicon support substrate and the piezoelectric body and including a low-acoustic-impedance layer having a relatively low acoustic impedance and a high-acoustic-impedance layer having a relatively high acoustic impedance.

13. The acoustic wave device according to claim 1, further comprising a dielectric film covering the functional electrode.

14. The acoustic wave device according to claim 1, wherein
the through-via electrodes are located in a region surrounded by the support layer when viewed in plan view.

15. The acoustic wave device according to claim 1, wherein the support layer is directly provided on the silicon support substrate.

16. A high-frequency front-end circuit comprising:
the acoustic wave device according to claim 1; and
a power amplifier; wherein
the acoustic wave device is connected to an output side of the power amplifier.

17. A communication device comprising:
the high-frequency front-end circuit according to claim 16; and
an RF signal processing circuit; wherein
the power amplifier is connected to an output side of the RF signal processing circuit.

18. The acoustic wave device according to claim 11, wherein, when a wavelength that is defined by a pitch of electrode fingers of the IDT electrode is $\lambda$, a film thickness of the high-acoustic-velocity film is about $0.5\lambda$ or more.

19. The acoustic wave device according to claim 14, wherein the second end portion of each of the through-via electrodes is electrically connected to a respective terminal electrode provided on the surface of the silicon support substrate located on the side opposite to the side on which the piezoelectric body is laminated on the silicon support substrate.

20. The acoustic wave device according to claim 1, wherein the functional electrode is an acoustic wave resonator and an acoustic wave filter.

* * * * *